(12) United States Patent
Fujiwara et al.

(10) Patent No.: US 9,377,686 B2
(45) Date of Patent: Jun. 28, 2016

(54) PHOTOSENSITIVE RESIN COMPOSITION, CONDUCTIVE WIRE PROTECTION FILM, AND TOUCH PANEL MEMBER

(71) Applicant: TORAY INDUSTRIES, INC., Tokyo (JP)

(72) Inventors: Takenori Fujiwara, Otsu (JP); Yugo Tanigaki, Otsu (JP); Ichiro Masuda, Otsu (JP); Yusuke Fukuzaki, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 14/411,442

(22) PCT Filed: Jun. 6, 2013

(86) PCT No.: PCT/JP2013/065701
§ 371 (c)(1),
(2) Date: Dec. 26, 2014

(87) PCT Pub. No.: WO2014/010345
PCT Pub. Date: Jan. 16, 2014

(65) Prior Publication Data
US 2015/0205203 A1    Jul. 23, 2015

(30) Foreign Application Priority Data

Jul. 9, 2012   (JP) .................................. 2012-153406

(51) Int. Cl.
| | | |
|---|---|---|
| *G03F 7/038* | (2006.01) | |
| *G03F 7/027* | (2006.01) | |
| *G03F 7/00* | (2006.01) | |
| *G03F 7/075* | (2006.01) | |
| *C08F 290/12* | (2006.01) | |

(52) U.S. Cl.
CPC .......... *G03F 7/0388* (2013.01); *C08F 290/126* (2013.01); *G03F 7/0007* (2013.01); *G03F 7/027* (2013.01); *G03F 7/038* (2013.01); *G03F 7/0755* (2013.01); *G06F 2203/04103* (2013.01)

(58) Field of Classification Search
None
See application file for complete search history.

(56) References Cited

U.S. PATENT DOCUMENTS

| | | | |
|---|---|---|---|
| 2003/0207203 | A1 | 11/2003 | Tsuchimura |
| 2006/0027307 | A1 | 2/2006 | Bidwell |
| 2010/0128001 | A1 | 5/2010 | Kimura |
| 2011/0256482 | A1* | 10/2011 | Tatsuhiro ................... 430/287.1 |

FOREIGN PATENT DOCUMENTS

| | | |
|---|---|---|
| JP | 2004118017 | 4/2004 |
| JP | 2004157419 | 6/2004 |
| JP | 2006030809 | 2/2006 |
| JP | 2006072344 | 3/2006 |
| JP | 2007233184 | 9/2007 |
| JP | 2007279819 | 10/2007 |
| JP | 2010024434 | 2/2010 |
| JP | 2011075923 | 4/2011 |
| JP | 2012098344 | 5/2012 |
| WO | 2009104461 | 8/2009 |

OTHER PUBLICATIONS

Registry No. 40220-08-7 substance file from Scifinder database,. CAS Registry number, 8 pages down loaded Jul. 2015.*
International Search Report for International Application No. PCT/JP2013/065701 mailed Sep. 3, 2013.

* cited by examiner

*Primary Examiner* — Cynthia Hamilton
(74) *Attorney, Agent, or Firm* — RatnerPrestia (57) ABSTRACT

The present invention provides a photosensitive resin composition comprising an unsaturated group-containing resin (D), a (meth)acrylic compound (E) having a specific structure, a silane compound (G) having a substituent selected from the group consisting of an amino group, an amide group, a ureido group, a ketimine group, and an isocyanate group, and a photo-polymerization initiator (F), the unsaturated group-containing resin (D) being obtained by adding an epoxy group-containing unsaturated compound (C) to some acid radicals of a copolymer obtained by copolymerizing a (meth)acrylic ester (A) with an unsaturated group- and acid-containing compound (B).

8 Claims, 2 Drawing Sheets

PHOTOSENSITIVE RESIN COMPOSITION, CONDUCTIVE WIRE PROTECTION FILM, AND TOUCH PANEL MEMBER

CROSS REFERENCE TO RELATED APPLICATIONS

This is the U.S. National Phase application of PCT/JP2013/065701, filed Jun. 6, 2013, which claims priority to Japanese Patent Application No. 2012-153406, filed Jul. 9, 2012.

TECHNICAL FIELD OF THE INVENTION

The present invention relates to a photosensitive resin composition, a conductive wire-protecting film, and a touch panel member.

BACKGROUND OF THE INVENTION

With the proliferation of smartphones and tablet terminals, capacitive touch panels have recently been receiving attention. Sensor substrates for capacitive touch panels typically have wiring in which indium tin oxide (ITO) or metal (e.g., silver, molybdenum, or aluminum) is patterned on a glass, insulating films at intersections of wires, and a protecting film to protect ITO and metal. Typically, protecting films are formed from a high-hardness inorganic compound $SiO_2$ or SiNx, photosensitive clear materials, or the like (Patent Document 1), and insulating films are formed from photosensitive clear materials. Inorganic materials, however, have a problem of high production cost: for example, the film is formed at a high temperature by chemical vapor deposition (CVD) of $SiO_2$ or SiNx, and in addition, an increased number of processes is required because patterning using resists is performed. For photosensitive clear materials, production cost can be reduced because of a decreased number of processes, but there is a problem of poor hardness and a chemical resistance insufficient to withstand a mass production process. Further, the photosensitive clear materials are also used for insulating films, but they have a problem in that outgas generates during a subsequent ITO-forming process, increasing the resistance of ITO. Such being the situation, photosensitive clear materials are now demanded that have high hardness, is excellent in transparency, heat resistance, and chemical resistance, and further can be patterned.

Known photosensitive clear materials include UV-crosslinking coating compositions containing an alkali-soluble polymer, a monomer, a photo-polymerization initiator, and other additives. The UV-crosslinking coating compositions are used, for example, as overcoat materials or spacer materials for color filters, and also used for color resists when further containing a coloring agent (Patent Documents 2 and 3). Furthermore, the UV-crosslinking coating compositions are used in wide applications such as interlayer dielectric film formation and solder resists (Patent Documents 4 and 5).

Multifunctional epoxy compounds are known to contribute to improvement of the properties of the UV-crosslinking coating compositions as described above, more specifically, improvement of chemical resistance (Patent Document 3), improvement of heat resistance (Patent Document 4), and improvement of photosensitivity (Patent Document 5).

PATENT DOCUMENTS

Patent Document 1: JP 2007-279819 A
Patent Document 2: JP 2006-30809 A
Patent Document 3: JP 2010-24434 A
Patent Document 4: JP 2011-75923 A
Patent Document 5: JP 2007-233184 A

SUMMARY OF THE INVENTION

When the UV-crosslinking coating composition as described above contains an epoxy compound, however, curing reaction proceeds little by little at normal temperature, and there is a problem of degradation of the composition; thus, in fact, photosensitive clear materials that can be patterned with an alkaline developing solution and have satisfactory storage stability, while also having properties such as high hardness, high transparency, high heat resistance, and high chemical resistance, are hitherto not known at all.

Thus, the present invention aims to provide an alkali-developable photosensitive resin composition that is extremely excellent in storage stability while having properties such as high hardness, high transparency, high heat resistance, and high chemical resistance.

The present invention provides a photosensitive resin composition comprising an unsaturated group-containing resin (D), a (meth)acrylic compound (E) having a specific structure, and a photo-polymerization initiator (F), the unsaturated group-containing resin (D) being obtained by adding an epoxy group-containing unsaturated compound (C) to some acid radicals of a copolymer obtained by copolymerizing a (meth)acrylic ester (A) with an unsaturated group- and acid-containing compound (B).

According to the present invention, a photosensitive resin composition can be provided that is excellently patterned using an alkaline developing solution, provides a cured film having high hardness, high transparency, high heat resistance, and high chemical resistance upon UV curing or thermal curing, and is extremely excellent in storage stability.

The photosensitive resin composition comprises an unsaturated group-containing resin (D), a (meth)acrylic compound (E) having a specific structure, and a photo-polymerization initiator (F), the unsaturated group-containing resin (D) being obtained by adding an epoxy group-containing unsaturated compound (C) to some acid radicals of a copolymer obtained by copolymerizing a (meth)acrylic ester (A) with an unsaturated group- and acid-containing compound (B).

The (meth)acrylic ester (A) is preferably a compound represented by Formula (1) or Formula (2) below.

[Chemical Formula 1]

(1)

(In the formula, $R^1$ represents hydrogen or methyl, and $R^2$ represents $C_1$-$C_{10}$ alkyl or an aromatic group.)

[Chemical Formula 2]

(2)

(In the formula, $R^3$ represents hydrogen or methyl; $R^4$ and $R^5$ each independently represent $C_1$-$C_{10}$ alkylene, phenylene, or naphthalene; $R^6$ represents $C_1$-$C_{10}$ alkyl or an aromatic group; l represents an integer of 0 or 1; and n represents an integer of 0 to 6.)

Specific examples of $R^2$ and $R^6$ include methyl, ethyl, propyl, butyl, pentyl, cyclopentyl, hexyl, cyclohexyl, decanyl, phenyl, and naphthyl.

Specific examples of the (meth)acrylic ester (A) include alkyl (meth)acrylates such as methyl (meth)acrylate, ethyl (meth)acrylate, propyl (meth)acrylate, butyl (meth)acrylate, pentyl (meth)acrylate, and hexyl (meth)acrylate; hydroxyl group-containing (meth)acrylates such as 2-hydroxyethyl (meth)acrylate, hydroxypropyl (meth)acrylate, hydroxybutyl (meth)acrylate, and caprolactone-modified 2-hydroxyethyl (meth)acrylate; and (meth)acrylates such as methoxydiethylene glycol (meth)acrylate, ethoxydiethylene glycol (meth) acrylate, isooctyloxydiethylene glycol (meth)acrylate, phenoxytriethylene glycol (meth)acrylate, methoxytriethylene glycol (meth)acrylate, and methoxypolyethylene glycol (meth)acrylate.

Specific examples of the unsaturated group- and acid-containing compound (B) include acrylic acid, methacrylic acid, acid anhydride group-containing (meth)acrylic compounds, vinyl phenol, modified unsaturated monocarboxylic acids, such as β-carboxyethyl (meth)acrylate, which are chain-extended between an unsaturated group and a carboxylic acid, 2-acryloyloxyethylsuccinic acid, 2-acryloyloxyethylphthalic acid, 2-acryloyloxyethylhexahydrophthalic acid, itaconic acid, itaconic anhydride, mono(2-acryloyloxyethyl) succinate, mono(2-acryloyloxyethyl) phthalate, mono(2-acryloyloxyethyl) tetrahydrophthalate, unsaturated monocarboxylic acids having a lactone-modified ester bond, and modified unsaturated monocarboxylic acids having an ether bond.

Specific examples of modified unsaturated monocarboxylic acids having a lactone-modified ester bond include compounds obtained by lactone-modifying a (meth)acrylic acid and lactone-modified compounds obtained by acid-modifying a terminal hydroxyl group with an acid anhydride.

Specific examples of compounds obtained by lactone-modifying a (meth)acrylic acid include a compound represented by Formula (3) below. Specific examples of lactone-modified compounds obtained by acid-modifying a terminal hydroxyl group with an acid anhydride include a compound represented by Formula (4) below.
[Chemical Formula 3]

(3)

[Chemical Formula 4]

(4)

(In Formulas (3) and (4), $R^7$ represents hydrogen or methyl; $R^8$ and $R^9$ each independently represent hydrogen, methyl, or ethyl; $R^{10}$ represents a saturated or unsaturated $C_1$-$C_{10}$ divalent aliphatic hydrocarbon group, a saturated or unsaturated $C_1$-$C_6$ divalent alicyclic hydrocarbon group, p-xylylene, or phenylene; p represents an integer of 4 to 8; and q represents an integer of 1 to 10.)

Specific examples of modified unsaturated monocarboxylic acids having an ether bond include a compound represented by Formula (5) below obtained by adding an epoxy compound such as ethylene oxide to a (meth)acrylic acid and acid-modifying the molecular end hydroxyl group of the adduct with an acid anhydride:

[Chemical Formula 5]

(5)

(In the formula, $R^7$ represents hydrogen or methyl; $R^8$ and $R^9$ each independently represent hydrogen, methyl, ethyl, propyl, or butyl; $R^{10}$ represents a saturated or unsaturated $C_1$-$C_{10}$ divalent aliphatic hydrocarbon group, a saturated or unsaturated $C_1$-$C_6$ divalent alicyclic hydrocarbon group, p-xylylene, or phenylene; and p and q each independently represent an integer of 1 to 10.) Alternatively, a compound containing two or more carboxyl groups in its molecule, such as maleic acid (hereinafter referred to as "MA"), may also be used. These may be used alone or in combination.

Further, in addition to the above-described specific examples of the unsaturated group- and acid-containing compound (B), the photosensitive resin composition of the present invention may contain an unsaturated group-containing compound, for example, an aliphatic vinyl compound such as butadiene; an aromatic vinyl compound such as divinylbenzene, styrene, p-methylstyrene, o-methylstyrene, m-methylstyrene, or α-methylstyrene; vinyl acetate; or an unsaturated amide compound such as N-acrylamide.

Adding the epoxy group-containing unsaturated compound (C) to some acid radicals of the copolymer obtained by copolymerizing the (meth)acrylic ester (A) with the unsaturated group- and acid-containing compound (B) (hereinafter referred to as "base polymer") gives the unsaturated group-containing resin (D).

The epoxy group-containing unsaturated compound (C) is a compound having at least one radically polymerizable unsaturated group and epoxy group in one molecule. Specific examples of the epoxy group-containing unsaturated compound (C) include an epoxy group-containing unsaturated alicyclic compound represented by Formula (6) or (7) below, glycidyl (meth)acrylate, α-ethyl glycidyl (meth)acrylate, α-n-propyl glycidyl (meth)acrylate, α-n-butyl glycidyl (meth)acrylate, 3,4-epoxybutyl (meth)acrylate, 3,4-epoxyheptyl (meth)acrylate, α-ethyl-6,7-epoxyheptyl (meth)acrylate, allyl glycidyl ether, vinyl glycidyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, a-methyl-p-vinylbenzyl glycidyl ether, 2,3-diglycidyl oxymethylstyrene, 2,4-diglycidyl oxymethylstyrene, 2,5-diglycidyl oxymethylstyrene, 2,6-diglycidyl oxymethylstyrene, 2,3,4-triglycidyl oxymethylstyrene, 2,3,5-triglycidyl oxymethyistyrene, 2,3,6-triglycidyl oxymethylstyrene, 3,4,5-triglycidyl oxymethyistyrene, and 2,4,6-triglycidyl oxymethyistyrene. Epoxy group-containing unsaturated alicyclic compounds represented by Formula (6) to Formula (20) are preferred, and 3,4-epoxycyclohexylmethyl (meth)acrylate is more preferred. These epoxy group-containing unsaturated compounds may be used alone or in combination of two or more kinds.

[Chemical Formula 6]

(6)

(7)

(8)

(9)

(10)

(11)

(12)

(13)

[Chemical Formula 7]

(14)

-continued (15)

(16)

(17)

(18)

(19)

(20)

(In Formula (6) to Formula (20), $R^{11}$ represents hydrogen or methyl; $R^{12}$ and $R^{13}$ each independently represent a direct bond or a $C_1$-$C_{10}$ divalent hydrocarbon group; and m represents an integer of 1 to 10.)

Specific examples of the $C_1$-$C_{10}$ divalent hydrocarbon group of $R^{12}$ and $R^{13}$ include —$(CH_2)_r$—, -Ph-, —Na—, and -Cy-. Here, r represents an integer of 1 to 10; Ph represents a benzene skeleton; Na represents a naphthalene skeleton; and Cy represents a cyclohexyl skeleton, a cyclopentyl skeleton, a norbornene skeleton, a norbornane skeleton, a tricyclodecane skeleton, or the like.

The amount of addition of the epoxy group-containing unsaturated compound (C) is preferably 5 to 80% by weight based on the resulting unsaturated group-containing resin (D), more preferably 5 to 70% by weight, and still more preferably 5 to 60% by weight. An addition amount of less than 5% by weight leads to poor UV curability, resulting in reduced physical properties of a cured coating. An addition amount of 80% by weight or more leads to poor storage stability of resin.

The acid number of the unsaturated group-containing resin (D) is preferably 10 to 200 KOH-mg/g, more preferably 20 to 170 KOH-mg/g, and still more preferably 30 to 150 KOH-mg/g. An acid number of less than 10 KOH-mg/g leads to difficulty in removing an uncured film with a dilute aqueous alkaline solution. An acid number of more than 200 KOH-mg/g leads to poor water resistance and poor electrical properties of a cured coating. When the acid number is in the appropriate range, residues after development of the photosensitive resin composition in an aqueous alkaline solution is reduced, and also film loss at exposed portions is reduced, leading to formation of a good pattern.

The weight average molecular weight (hereinafter referred to as "Mw") of the unsaturated group-containing resin (D), as measured by gel permeation chromatography (GPC) in terms of polystyrene, is preferably 5,000 to 100,000, more preferably 5,000 to 40,000. An Mw of less than 5,000 leads to (i) poor tack-free properties and (ii) poor moisture resistance of a coating after exposure to light, which can cause film loss during the development, leading to a low resolution. An Mw of more than 100,000 leads to (i) significantly poor developability and (ii) poor storage stability.

Specific examples of the solvent used in the addition reaction of the epoxy group-containing unsaturated compound (C) to some acid radicals of the base polymer include aromatic hydrocarbons such as benzene, toluene, and xylenes; alcohols such as methanol, ethanol, and 2-propanol; ketones such as acetone, methyl ethyl ketone, and methyl isobutyl ketone; ethers such as diethyl ether, dibutyl ether, and dioxane; esters such as ethyl acetate, isobutyl acetate, ethylene glycol monoacetate, propylene glycol monoacetate, and dipropylene glycol monoacetate; ethylene glycol monoalkyl ethers; diethylene glycol monoalkyl ethers; propylene glycol monoalkyl ethers; dipropylene glycol monoalkyl ethers; butylene glycol monoalkyl ethers; ethylene glycol dialkyl ethers; diethylene glycol dialkyl ethers such as diethylene glycol dimethyl ether, diethylene glycol diethyl ether, and diethylene glycol ethyl methyl ether; ethylene glycol monoalkyl ether acetates; diethylene glycol monoalkyl ether acetates; amides such as dimethylformamide and dimethylacetamide; and halogenated hydrocarbons such as carbon tetrachloride and chloroform. These solvents may be used alone or in combination of two or more kinds.

The unsaturated group-containing resin (D) is required to have an ethylenically unsaturated double bond group in terms of photosensitivity and cured film hardness. Having an ethylenically unsaturated double bond group promotes curing upon exposure to light, improving the photosensitivity, and also improves the crosslink density after thermal curing, improving the cured film hardness. The double bond equivalent of the unsaturated group-containing resin (D) is preferably 150 to 10,000 g/mol, more preferably 200 to 5,000 g/mol, and still more preferably 200 to 2,000 g/mol. When the double bond equivalent is in the appropriate range, the hardness and crack resistance can be achieved both at a high level. "Double bond equivalent" as used herein refers to a resin weight per mol of unsaturated group. The double bond equivalent of the unsaturated group-containing resin (D) can be calculated by determining its iodine number.

The polymerization initiator used in the addition reaction of the epoxy group-containing unsaturated compound (C) to some acid radicals of the base polymer may be a conventional radical polymerization initiator. Specific examples of radical polymerization initiators include azo radical polymerization initiators such as 2,2'-azobisisobutyronitrile and 2,2'-azobis-(2,4-dimethylvaleronitrile); and peroxide radical polymerization initiators such as lauroyl peroxide, di-t-butyl peroxide, bis(4-t-butylcyclohexyl) peroxydicarbonate, t-butylperoxy(2-ethylhexanoate), methyl ethyl ketone peroxide, benzoyl peroxide, and cumene hydroperoxide. These radical polymerization initiators may be used alone or in combination of two or more kinds.

The molecular weight of the base polymer is determined according to the synthesis temperature, the amount and type of polymerization initiator used, the addition rate of monomer and polymerization initiator, the type and amount of solvent, and the like. The molecular weight of the base polymer is appropriately adjusted so that the molecular weight of the resulting unsaturated group-containing resin (D) is in a desired range: preferably, for example, the base polymer and a radical polymerization initiator are added into a solvent; the reaction vessel is purged thoroughly with nitrogen, for example, by bubbling to degassing under reduced pressure; and then the reaction is carried out at 60 to 110° C. for 30 to 300 minutes. When an acid anhydride group-containing (meth)acrylic compound is used, it is preferable to add a theoretical amount of water and carry out the reaction at 30 to 60° C. for 30 to 60 minutes. Optionally, a chain transfer agent such as a thiol compound may be used.

The reaction for obtaining the unsaturated group-containing resin (D) by causing ring-opening addition of the epoxy group-containing unsaturated compound (C) to carboxyl groups of the base polymer is carried out at 50 to 150° C. by mixing the base polymer, the epoxy group-containing unsaturated compound (C), a solvent, a catalyst for ring-opening addition, and optionally a polymerization inhibitor (H). When the temperature is 50° C. or lower, the reaction proceeds slowly, leading to decreased productivity. When the temperature is 150° C. or higher, gelation tends to occur during the reaction. To prevent such gelation, it is desirable to carry out the ring-opening addition reaction in the presence of molecular oxygen-containing gas. Typically, air is used as the molecular oxygen-containing gas and blown into a reactor.

Specific examples of the polymerization inhibitor (H) include di-t-butylated hydroxytoluene, butylated hydroxyanisole, hydroquinone, 1,4-benzoquinone, hydroquinone monomethyl ether, phenothiazine p-t-butylcatechol, 2,5-di-t-butylhydroquinone, mono-t-butylhydroquinone, p-benzoquinone, naphthoquinone, 2,5-diphenyl-p-benzoquinone, di-t-butyl-p-cresol, 2,5-di-t-butyl-4-methylphenol, 4-methoxyphenol, and t-butylcatechol. Specific examples of the polymerization inhibitor (H) that is commercially available include IRGANOX (registered trademark) 1010, 1035, 1076, IRGANOX, 1135, 1330, 1726, 1425, 1520, 245, 259, 3114, 565, and 295 (all available from BASF).

Specific examples of the catalyst for ring-opening addition include tertiary amines such as triethylamine, tetramethylethylenediamine, and tri-n-octylamine; quarternary ammonium salts such as tetramethylammonium chloride, tetramethylammonium bromide, and tetrabutylammonium bromide; alkylureas such as tetramethylurea; alkylguanidines such as tetramethylguanidine; tin catalysts such as tin(II) 2-ethylhexanoate and dibutyltin laurate; titanium catalysts such as titanium(IV) 2-ethylhexanoate; phosphorus catalysts such as triphenylphosphine (hereinafter referred to as "TPP") and triphenylphosphine oxide (hereinafter referred to as "TPPO"); chromium catalysts such as acetylacetonate chromium, chromium chloride, chromium octenate and chromium naphthenate; and cobalt catalysts such as cobalt octenate, among which phosphorus catalysts are preferred, and it is more preferable to use a tertiary phosphine and a tertiary phosphine oxide in combination. These catalysts for ring-opening addition may be used alone or in combination. The amount of these catalysts for ring-opening addition is preferably 0.01 to 10% by weight based on the epoxy group-containing unsaturated compound (C), more preferably 0.5 to 3.0% by weight. When the amount is less than 0.01% by weight, less catalytic effect is produced. It is not necessary to add the catalyst for ring-opening addition in an amount of more than 10% by weight.

The photosensitive resin composition is required to contain the (meth)acrylic compound (E) represented by Formula (21) below. It is presumed that because of the chemical stability of the isocyanuric ring skeleton of the (meth)acrylic compound (E), the photosensitive resin composition provides a cured film with improved heat resistance and chemical resistance.

[Chemical Formula 8]

(21)

(In the formula, $R^{14}$, $R^{15}$, and $R^{16}$ each independently represent hydrogen or methyl, and $R^{17}$, $R^{18}$, and $R^{19}$ each independently represent $C_1$-$C_{10}$ alkylene, phenylene, or cyclohexyl.)

Specific examples of the (meth)acrylic compound (E) include tris(acryloxymethyl)isocyanuric acid, tris(acryloxyethyl)isocyanuric acid, tris(acryloxyethyl)isocyanuric acid, tris(acryloxypropyl)isocyanuric acid, tris(acryloxybutyl)isocyanuric acid, tris(acryloxypentyl)isocyanuric acid, tris(acryloxyhexyl)isocyanuric acid, tris(methacryloxymethyl)isocyanuric acid, tris(methacryloxyethyl)isocyanuric acid, tris(methacryloxyethyl)isocyanuric acid, tris(methacryloxypropyl)isocyanuric acid, tris(methacryloxybutyl)isocyanuric acid, tris(methacryloxypentyl)isocyanuric acid, and tris(methacryloxyhexyl)isocyanuric acid.

The content of the (meth)acrylic compound (E) in the photosensitive resin composition of the present invention is preferably 50 parts by weight to 400 parts by weight based on 100 parts by weight of the unsaturated group-containing resin (D), more preferably 75 to 350 parts by weight, and still more preferably 100 to 300 parts by weight. When the content of the (meth)acrylic compound (E) is in this appropriate range, the heat resistance and chemical resistance of the cured film of the present invention can be sufficiently improved.

The photosensitive resin composition of an embodiment of the present invention is required to contain the photo-polymerization initiator (F). The photo-polymerization initiator (F) preferably decomposes and/or reacts upon exposure to light (including ultraviolet ray and electron beam) to generate radicals.

Specific examples of the photo-polymerization initiator (F) include 2-methyl-[4-(methylthio)phenyl]-2-morpholinopropan-1-one, 2-dimethylamino-2-(4-methylbenzyl)-1-(4-morpholin-4-yl-phenyl)-butan-1-one, 2-benzyl-2-dimethylamino-1-(4-morpholinophenyl)-butanone-1, 2,4,6-trimethylbenzoyl phenylphosphine oxide, bis(2,4,6-trimethylbenzoyl)-phenylphosphine oxide, bis(2,6-dimethoxybenzoyl)-(2,4,4-trimethylpentyl)-phosphine oxide, 1-phenyl-1,2-propanedione-2-(o-ethoxycarbonyl) oxime, 1,2-octanedione, 1-[4-(phenylthio)-2-(o-benzoyloxime)], 1-phenyl-1,2-butadione-2-(o-methoxycarbonyl) oxime, 1,3-diphenylpropanetrione-2-(o-ethoxycarbonyl) oxime, ethanone, 1-[9-ethyl-6-(2-methylbenzoyl)-9H-carbazol-3-yl]-, 1-(o-acetyloxime), 4,4-bis(dimethylamino) benzophenone, 4,4-bis(diethylamino)benzophenone, ethyl p-dimethylaminobenzoate, 2-ethylhexyl-p-dimethylaminobenzoate, ethyl p-diethylaminobenzoate, diethoxyacetophenone, 2-hydroxy-2-methyl-1-phenylpropan-1-one, benzyldimethylketal, 1-(4-isopropylphenyl)-2-hydroxy-2-methylpropan-1-one, 4-(2-hydroxyethoxy)phenyl-(2-hydroxy-2-propyl) ketone, 1-hydroxycyclohexyl-phenyl ketone, benzoin, benzoin methyl ether, benzoin ethyl ether, benzoin isopropyl ether, benzoin isobutyl ether, benzophenone, methyl o-benzoylbenzoate, 4-phenylbenzophenone, 4,4-dichlorobenzophenone, hydroxybenzophenone, 4-benzoyl-4'-methyl-diphenyl sulfide, alkylated benzophenone, 3,3',4,4'-tetra(t-butylperoxycarbonyl)benzophenone, 4-benzoyl-N,N-dimethyl-N-[2-(1-oxo-2-propenyloxy)ethyl]benzenemethanaminium bromide, (4-benzoylbenzyl)trimethylammonium chloride, 2-hydroxy-3-(4-benzoylphenoxy)-N,N,N-trimethyl-1-propenaminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthen-2-yloxy)-N,N,N-trimethyl-1-propanaminium chloride, 2,2'-bis(o-chlorophenyl)-4,5,4',5'-tetraphenyl-1,2-biimidazole, 10-butyl-2-chloroacridone, 2-ethylanthraquinone, benzyl, 9,10-phenanthrenequinone, camphorquinone, methylphenyl glyoxyester, η5-cyclopentadienyl-η6-cumenyl-iron(1+)-hexafluorophosphate(1−), diphenyl sulfide derivatives, bis (η5-2,4-cyclopentadien-1-yl)-bis(2,6-difluoro-3-(1H-pyrrol-1-yl)-phenyl)titanium, thioxanthone, 2-methylthioxanthone, 2-chlorothioxanthone, 4-benzoyl-4-methyl phenyl ketone, dibenzyl ketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzyl methoxyethyl acetal, anthraquinone, 2-t-butylanthraquinone, 2-aminoanthraquinone, β-chloranthraquinone, anthrone, benzanthrone, dibenzosuberone, methyleneanthrone, 4-azidobenzalacetophenone, 2,6-bis(p-azidobenzylidene)cyclohexane, 2,6-bis(p-azidobenzylidene)-4-methylcyclohexanone, naphthalenesulfonyl chloride, quinolinesulfonyl chloride, N-phenylthioacridone, benzothiazole disulfide, triphenylphosphine, carbon tetrabromide, tribromophenylsulfone, benzoyl peroxide, and a combination of a photoreducible dye such as eosin or methylene blue and a reducing agent such as ascorbic acid or triethanolamine. These photo-polymerization initiators (F) may be used alone or in combination of two or more kinds, but to enhance the hardness of the resulting cured film, α-aminoalkylphenone compounds, acylphosphine oxide compounds, oxime ester compounds, benzophenone compounds having an amino group, and benzoic ester compounds having an amino group are preferred.

Specific examples of α-aminoalkylphenone compounds include 2-methyl-[4-(methylthio)phenyl]-2-morpholinopropan-1-one, 2-dimethylamino-2-(4-methylbenzyl)-1-(4-morpholin-4-yl-phenyl)-butan-1-one, and 2-benzyl-2-dimethylamino-1-(4-morpholinophenyl)-butanone-1. Specific examples of acylphosphine oxide compounds include 2,4,6-trimethylbenzoyl phenylphosphine oxide, bis(2,4,6-trimethylbenzoyl)-phenylphosphine oxide, and bis(2,6-dimethoxybenzoyl)-(2,4,4-trimethylpentyl)-phosphine oxide. Specific examples of oxime ester compounds include 1-phenyl-1,2-propanedione-2-(o-ethoxycarbonyl)oxime, 1,2-octanedione, 1-[4-(phenylthio)-2-(o-benzoyloxime)], 1-phenyl-1,2-butadione-2-(o-methoxycarbonyl)oxime, 1,3-diphenylpropanetrione-2-(o-ethoxycarbonyl)oxime, and ethanone, 1-[9-ethyl-6-(2-methylbenzoyl)-9H-carbazol-3-yl]-, 1-(o-acetyloxime). Specific examples of benzophenone compounds having an amino group include 4,4-bis(dimethylamino)benzophenone and 4,4-bis(diethylamino)benzophenone. Specific examples of benzoic ester compounds having an amino group include ethyl p-dimethylaminobenzoate, 2-ethylhexyl-p-dimethylaminobenzoate, and ethyl p-diethylaminobenzoate.

The content of the photo-polymerization initiator (F) in the photosensitive resin composition of, the present invention is preferably 0.1 to 20 parts by weight based on 100 parts by weight of the unsaturated group-containing resin (D) and the (meth)acrylic compound (E). When the content of the photo-polymerization initiator (F) is in this appropriate range, curing of a film sufficiently proceeds, and melting of the remaining polymerization initiator can be prevented to ensure the solvent resistance.

The photosensitive resin composition of the present invention may contain a silane compound (G) having a substituent selected from the group consisting of an amino group, an amide group, a ureido group, a ketimine group, and an isocyanate group. The silane compound (G) is preferably an alkoxysilane compound from the standpoint of adhesion to a substrate. Specific examples of alkoxysilane compounds include silane compounds having an amino compound, such as N-2-(aminoethyl)-3-aminopropyldiethoxysilane (KBM-602), N-2-(aminoethyl)-3-aminopropyltrimethoxysilane (KBM-603), 3-aminopropyltrimethoxysilane (KBM-903), 3-aminopropyltriethoxysilane (KBE-903), N-phenyl-3-aminopropyltrimethoxysilane (KBM-573), and hydrochloride of N-(vinylbenzyl)-2-aminoethyl-3-aminopropyltrimethoxysilane (KBM-575); silane compounds having a ketimine compound, such as 3-triethoxysilyl-N-(1,3-dimethyl-butylidene)propylamine (KBE-9103); silane compounds having a ureido compound, such as 3-ureidopropyltriethoxysilane (KBE-585) and 3-ureidopropyltriethoxysilane (KBE-585); and silane compounds having an isocyanate group, such as 3-isocyanatepropyltriethoxysilane (KBM-9007) (all available from Shin-Etsu Chemical Co., Ltd.), and silane compounds having a ketimine compound, silane compounds having a ureido compound, and silane compounds having an isocyanate group are preferred.

The content of the silane compound (G) in the photosensitive resin composition of the present invention is preferably 0.1 to 20 parts by weight based on 100 parts by weight of the unsaturated group-containing resin (D) and the (meth)acrylic compound (E), more preferably 0.2 to 10 parts by weight, and still more preferably 0.5 to 7 parts by weight. When the content of the silane compound (G) is in this appropriate range, adhesion at the interface between a cured film obtained from the photosensitive resin composition of the present invention and a glass substrate, an ITO wire surface, and a molybdenum wire surface can be sufficiently enhanced, and adhesion at the interface after chemical treatment can be ensured.

The photosensitive resin composition of the present invention may contain the polymerization inhibitor (H) described above. Containing the polymerization inhibitor in an appropriate amount improves the resolution after development.

The content of the polymerization inhibitor (H) in the photosensitive resin composition of the present invention is preferably 0.1 to 5 parts by weight based on 100 parts by weight of the unsaturated group-containing resin (D). When the content of the polymerization inhibitor (H) is in this appropriate range, residues after development can be reduced, and high resolution can be ensured.

The photosensitive resin composition of the present invention preferably contains a carboxylic acid-containing compound (I) represented by a general formula selected from the group consisting of Formula (22), Formula (23), and Formula (24) below. Containing the carboxylic acid-containing compound (I) reduces residues after development and ensures high resolution.

[Chemical Formula 9]

(22)

[Chemical Formula 10]

(23)

[Chemical Formula 11]

(24)

(In Formula (22), Formula (23), and Formula (24), X each independently represents hydrogen, $C_1$-$C_6$ alkyl, acryloyl, or methacryloyl, provided that at least one X is acryloyl or methacryloyl; Y represents $C_1$-$C_{10}$ alkylene, $C_2$-$C_{10}$ alkylene having one unsaturated bond, phenylene, or cyclohexyl; and P represents an integer of 0 to 6.)

Specific examples of the carboxylic acid-containing compound (I) represented by Formula (22) include succinic acid, oxalic acid, MA, norbornene dicarboxylic acid, trimellitic acid, pyromellitic acid, 5-norbornene-2-carboxylic acid, 5-norbornene-2,3-dicarboxylic acid, acetic acid, valeric acid, itaconic acid, phthalic acid, and tetrahydrophthalic acid.

The carboxylic acid-containing compound (I) represented by Formula (23) and Formula (24) is a polyfunctional (meth)acrylate compound having at least one carboxyl group in its molecule, and such a compound is prepared by reacting a compound having at least one acid anhydride group in its molecule with a hydroxyl group-containing polyfunctional (meth)acrylate having a hydroxyl group and two or more (meth)acryloyl groups in its molecule.

Specific examples of the compound having at least one acid anhydride group in its molecule include succinic anhydride, maleic anhydride, glutaric anhydride, itaconic anhydride, phthalic anhydride, and tetrahydrophthalic anhydride, and succinic anhydride is preferred. Specific examples of the hydroxyl group-containing polyfunctional (meth)acrylate having a hydroxyl group and two or more (meth)acryloyl groups in its molecule include trimethylolpropane diacrylate, trimethylolpropane dimethacrylate, pentaerythritol diacrylate, dipentaerythritol triacrylate, dipentaerythritol tetraacrylate, and dipentaerythritol pentaacrylate.

Specific examples of the carboxylic acid-containing compound (I) represented by Formula (23) and Formula (24)

include mono-[3-(3-acryloyloxy-2,2-bis-acryloyloxymethyl-propyl] succinate which is a carboxyl group-containing trifunctional acrylate and mono-[3-(3-acryloyloxy-2,2-bis-acryloyloxymethyl-propoxy)-2,2-bis-acryloyloxymethyl-propyl] succinate which is a carboxyl group-containing pentafunctional acrylate.

The carboxylic acid-containing compound (I) preferably has an ethylenically unsaturated group.

The content of the carboxylic acid-containing compound (I) in the photosensitive resin composition of the present invention is preferably 1 to 150 parts by weight based on 100 parts by weight of the unsaturated group-containing resin (D). When the content of the carboxylic acid-containing compound (I) is in this appropriate range, residues after development can be reduced, and high resolution can be ensured.

The photosensitive resin composition of the present invention may contain a polyfunctional monomer (J) in addition to the (meth)acrylic compound (E) and the carboxylic acid-containing compound (I). Photoirradiation of the photo-polymerization initiator (F) promotes polymerization of the polyfunctional monomer (J), as a result of which exposed portions of the photosensitive resin composition become insoluble to an aqueous alkaline solution, and a negative-tone pattern can be formed. Here, the polyfunctional monomer (J) is a compound having two or more ethylenically unsaturated double bonds in its molecule. The polyfunctional monomer (J) preferably has a (meth)acrylic group which easily undergoes radical polymerization. The double bond equivalent of the polyfunctional monomer (J) is preferably 80 to 400 g/mol in terms of sensitivity and hardness.

Specific examples of the polyfunctional monomer (J) include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol pentaacrylate, dipentaerythritol hexaacrylate, tripentaerythritol heptaacrylate, tripentaerythritol octaacrylate, tetrapentaerythritol nonaacrylate, tetrapentaerythritol decaacrylate, pentapentaerythritol undecaacrylate, pentapentaerythritol dodecaacrylate, tripentaerythritol heptamethacrylate, tripentaerythritol octamethacrylate, tetrapentaerythritol nonamethacrylate, tetrapentaerythritol decamethacrylate, pentapentaerythritol undecamethacrylate, pentapentaerythritol dodecamethacrylate, dimethylol-tricyclodecane diacrylate, ethoxylated bisphenol A diacrylate, 9,9-bis[4-(2-acryloyloxyethoxy)phenyl]fluorene, 9,9-bis[4-(2-methacryloyloxyethoxy)phenyl]fluorene, 9,9-bis[4-(2-methacryloyloxyethoxy)-3-methylphenyl]fluorene, (2-acryloyloxypropoxy)-3-methylphenyl]fluorene, 9,9-bis[4-(2-acryloyloxyethoxy)-3,5-dimethylphenyl]fluorene, and 9,9-bis[4-(2-methacryloyloxyethoxy)-3,5-dimethylphenyl]fluorene. To improve the sensitivity, pentaerythritol tetraacrylate, dipentaerythritol pentaacrylate, dipentaerythritol hexaacrylate, tripentaerythritol heptaacrylate, and tripentaerythritol octaacrylate are preferred, and to improve the hydrophobicity, dimethylol-tricyclodecane diacrylate, dimethylol-tricyclodecane dimethacrylate, ethoxylated bisphenol A diacrylate, and 9,9-bis[4-(2-acryloyloxyethoxy)phenyl]fluorene are preferred.

The content of the polyfunctional monomer (J) in the photosensitive resin composition of the present invention may be appropriately determined according to the desired thickness and the intended use, and it is preferably 1 to 50 parts by weight based on 100 parts by weight of the total of the unsaturated group-containing resin (D), the (meth)acrylic compound (E), and the polyfunctional monomer (J), more preferably 1 to 100 parts by weight.

The photosensitive resin composition of the present invention may contain an epoxy compound, a polymerizable vinyl monomer, or a polymerizable prepolymer as long as the intended use and the required properties are not compromised.

Specific examples of epoxy compounds include bisphenol A epoxy resins, bisphenol S epoxy resins, bisphenol F epoxy resins, phenol novolac epoxy resins, cresol novolac epoxy resins, N-glycidyl epoxy resins, and alicyclic epoxy resins. These epoxy resins may be used alone or in combination of two or more kinds. These epoxy compounds are preferably added in an amount of 0 to 100 parts by weight based on the unsaturated group-containing resin, more preferably added in an amount of 0 to 10 parts by weight, and still more preferably added in an amount of 0 to 5 parts by weight. When the amount of the epoxy compound is more than 100 parts by weight, the unsaturated group-containing resin (D) have degraded properties. The amount of the epoxy compound is preferably as small as possible because the epoxy compound reacts with carboxylic acid in the unsaturated group-containing resin (D) during pre-baking, causing residues during a developing process or reducing storage stability in a chemical solution.

The photosensitive resin composition of the present invention may contain various curing agents for promoting or facilitating curing of the resin composition. Specific examples of such curing agents include nitrogen-containing organic matter, silicone resin curing agents, various metal alcoholates, various metal chelate compounds, isocyanate compounds and polymers thereof, methylolated melamine derivatives, and methylolated urea derivatives, and from the standpoint of stability of the curing agent or processability of the resulting coating, metal chelate compounds, methylolated melamine derivative, and methylolated urea derivatives are preferred. These curing agents may be used alone or in combination of two or more kinds.

The photosensitive resin composition of the present invention may contain a UV absorber. Containing a UV absorber improves light resistance of the resulting cured film and improves the resolution after development in applications that require patterning. The UV absorber is preferably a benzotriazole compound, a benzophenone compound, or a triazine compound from the standpoint of transparency or non-stainability.

Specific examples of the UV absorber made of a benzotriazole compound include 2-(2H-benzotriazol-2-yl)phenol, 2-(2H-benzotriazol-2-yl)-4,6-tert-pentylphenol, 2-(2H-benzotriazol-2-yl)-4-(1,1,3,3-tetramethylbutyl)phenol, 2(2H-benzotriazol-2-yl)-6-dodecyl-4-methylphenol, and 2-(2'-hydroxy-5'-methacryloxyethylphenyl)-2H-benzotriazole.

Specific examples of the UV absorber made of a benzophenone compound include 2-hydroxy-4-methoxybenzophenone. Specific examples of the UV absorber made of a triazine compound include 2-(4,6-diphenyl-1,3,5 triazin-2-yl)-5-[(hexyl)oxy]-phenol.

The photosensitive resin composition of the present invention may contain a solvent. The solvent is preferably a compound having an alcoholic hydroxyl group, a cyclic compound having a carbonyl group, or a glycol diether compound because they are able to dissolve components uniformly and improve the transparency of the resulting coating. These solvents may be used alone or in combination of two or more kinds. Further, solvents having a boiling point under atmospheric pressure of 110 to 250° C. are more preferred. When the boiling point is 110° C. or higher, drying proceeds moderately during coating, which provides a satisfactory coating without uneven coating. When the boiling point is 250° C. or lower, the amount of residual solvent in the coating can be reduced, and film shrinkage upon thermal curing can be reduced, thus providing better evenness.

Specific examples of the compound having an alcoholic hydroxyl group and a boiling point under atmospheric pressure of 110 to 250° C. include acetol, 3-hydroxy-3-methyl-2-butanone, 4-hydroxy-3-methyl-2-butanone, 5-hydroxy-2-pentanone, 4-hydroxy-4-methyl-2-pentanone (diacetone alcohol), ethyl lactate, butyl lactate, propylene glycol monomethyl ether, propylene glycol monoethyl ether, propylene glycol mono n-propyl ether, propylene glycol mono n-butyl ether, propylene glycol mono t-butyl ether, 3-methoxy-1-butanol, and 3-methyl-3-methoxy-1-butanol. From the standpoint of storage stability, diacetone alcohol, 3-methoxy-1-butanol, and 3-methyl-3-methoxy-1-butanol are preferred, and from the standpoint of step coverage, propylene glycol mono t-butyl ether is preferred.

Specific examples of the cyclic compound having a carbonyl group and a boiling point under atmospheric pressure of 110 to 250° C. include γ-butyrolactone, γ-valerolactone, δ-valerolactone, propylene carbonate, N-methylpyrrolidone, cyclohexanone, and cycloheptanone, and γ-butyrolactone is preferred.

Specific examples of the cyclic compound that is a glycol diether compound and has a boiling point under atmospheric pressure of 110 to 250° C. include ethylene glycol dimethyl ether, ethylene glycol diethyl ether, ethylene glycol dibutyl ether, diethylene glycol dimethyl ether, diethylene glycol diethyl ether, diethylene glycol ethyl methyl ether, propylene glycol dimethyl ether, propylene glycol diethyl ether, propylene glycol dibutyl ether, dipropylene glycol dimethyl ether, dipropylene glycol diethyl ether, and dipropylene glycol ethyl methyl ether, among which ethylene glycol diethyl ether, ethylene glycol dibutyl ether, diethylene glycol dimethyl ether, diethylene glycol diethyl ether, diethylene glycol ethyl methyl ether, dipropylene glycol dimethyl ether, dipropylene glycol diethyl ether, and dipropylene glycol ethyl methyl ether are preferred.

The photosensitive resin composition of the present invention may contain a solvent other than the above. Specific examples of such solvents include ketones such as methyl ethyl ketone, acetylacetone, methyl propyl ketone, methyl butyl ketone, methyl isobutyl ketone, diisobutyl ketone, cyclopentanone, and 2-heptanone; amides such as dimethylformamide and dimethylacetamide; and acetates such as ethyl acetate, propyl acetate, butyl acetate, isobutyl acetate, ethylene glycol monoethyl ether acetate, propylene glycol monomethyl ether acetate, 3-methoxybutyl acetate, and 3-methyl-3-methoxybutyl acetate.

The content of solvent in the photosensitive resin composition of the present invention may be appropriately determined according to, for example, the coating method, and when spin coating is used for film formation, the content of solvent is typically 50 to 95% by weight based on the total of the photosensitive resin composition.

The photosensitive resin composition of the present invention may contain a surfactant such as a fluorochemical surfactant or a silicone surfactant in order to improve the flowability during coating. Specific examples of surfactants include fluorochemical surfactants such as MEGAFACE (registered trademark) F142D, F172, F173, F183, F445, F470, F475, and F477 (all available from Dainippon Ink And Chemicals, Incorporated), and NBX-15 and FTX-218 (all available from Neos Company Limited); silicone surfactants such as BYK-333, BYK-301, BYK-331, BYK-345, and BYK-307 (all available from BYK-Chemie Japan); polyalkylene oxide surfactants; and poly(meth)acrylate surfactants. These surfactants may be used alone or in combination of two or more kinds.

The photosensitive resin composition of the present invention may optionally contain additives such as dissolution inhibitors, stabilizers, or antifoaming agents.

The solids concentration of the photosensitive resin composition of the present invention may be appropriately determined according to, for example, the coating method, and when spin coating is used for film formation, the solids concentration is typically in the range of 5 to 50% by weight.

A method of forming a cured film from the photosensitive resin composition of the present invention will be described below by way of example.

The photosensitive resin composition of the present invention is applied to a base substrate by a method such as microgravure coating, spin coating, dip coating, curtain flow coating, roll coating, spray coating, or slit coating, and pre-baked with a heater such as a hot plate or an oven. The pre-baking is carried out at a temperature in the range of 50 to 150° C. for 30 seconds to 30 minutes, and the film thickness after pre-baking is preferably 0.1 to 15 μm.

After the pre-baking, light of about 10 to 4000 $J/m^2$ (in terms of exposure at a wavelength of 365 nm) is applied through or not through a desired mask using an exposer such as a stepper, a mirror projection mask aligner (MPA), or a parallel light mask aligner (hereinafter referred to as "PLA"). UV-visible light such as j-ray, ray, g-ray, or h-ray, KrF (wavelength: 248 nm) laser or ArF (wavelength: 193 nm) laser, or the like can be used as an exposure light source. Post-exposure bake, in which the film after pre-baking is heated with a heater such as a hot plate or an oven at a temperature in the range of 150 to 450° C. for about 1 hour, may be performed.

For the photosensitive resin composition of the present invention, the sensitivity at patterning exposure with a PLA is preferably 100 to 4000 $J/m^2$. The sensitivity at patterning exposure with a PLA can be determined by the following method. Using a spin coater, the photosensitive resin composition is applied to a silicon wafer by spin coating at any rotation speed and pre-baked using a hot plate at 100° C. for 2 minutes to produce a film with a thickness of 2 μm. Using a PLA (PLA-501F; manufactured by Canon Inc.), the film produced is exposed to light from an ultra-high pressure mercury lamp through a gray scale mask for sensitivity measurement, puddle-developed with a 0.4 wt % aqueous tetramethylammonium hydroxide (hereinafter referred to as "TMAH") solution for a given time using an automatic developing apparatus (AD-2000 (trade name); manufactured by Takizawa Sangyo Co., Ltd.), and then rinsed with water for 30 seconds. For a pattern formed, the exposure amount at which a 30-μm line-and-space pattern is resolved at a width ratio of 1:1 (hereinafter referred to as "optimal exposure amount") is used as the sensitivity. Further, patterns with a different line-and-space width are resolved, and a minimal resolution pattern is used as the resolution.

After the patterning exposure, exposed portions are melted by development to obtain a negative-tone pattern. A preferred development method is immersion in a developing solution for 5 seconds to 10 minutes by means of, for example, showering, dipping, or puddling. A known alkaline developing solution can be used as a developing solution, and specific examples thereof include aqueous solutions containing one or more of inorganic alkalis such as hydroxides, carbonates, phosphates, silicates, and borates of alkali metals; amines such as 2-diethylaminoethanol, monoethanolamine, and diethanolamine; and quarternary ammonium salts such as tetramethylammonium hydroxide and choline. After the development, the film is preferably rinsed with water, and then may be dry-baked at a temperature in the range of 50 to 150° C. The film after development is heat-set at a temperature in the range of 120 to 300° C. for about 1 hour with a heater such as a hot plate or an oven to obtain a cured film.

The cured film obtained from the photosensitive resin composition of the present invention preferably has a thickness of 0.1 to 15 µm, and when the thickness is 1.5 µm, the cured film preferably has a hardness of 4H or more and a transmittance at a wavelength of 400 nm of 90% or more. The transmittance is a transmittance at a wavelength of 400 nm. The hardness and the transmittance of the cured film can be controlled by selecting the exposure amount or heat-setting temperature.

The cured film obtained from the photosensitive resin composition of the present invention can be used, for example, for various protecting films such as protecting films for touch panels, various hard coating materials, planarization films for thin film transistors, overcoats for color filters, anti-reflection films, and passivation films, optical filters, insulating films for touch panels, insulating films for thin film transistors, and photo spacers for color filters, and can be suitably used as a protecting film for touch panels because it has high hardness, high transparency, and high heat resistance. Examples of types of touch panel include the resistive film type, the optical type, the electromagnetic induction type, and the capacitive type. Protecting films for capacitive touch panels require particularly high hardness, and thus the cured film obtained from the photosensitive resin composition of the present invention can be particularly suitably used.

Forming the cured film obtained from the photosensitive resin composition of the present invention on a conductive wire prevents degradation (e.g., reduction of conductivity) of metals due to photoresists or chemical solution such as stripping solution. Specific examples of the metal to be protected include copper, silver, aluminum, chromium, molybdenum, titanium, ITO, indium zinc oxide (IZO), aluminum-doped zinc oxide (AZO), and $ZnO_2$.

EXAMPLES

The present invention will be described below with reference to examples, but embodiments of the present invention are not limited to these examples.

Synthesis Example 1

Synthesis of Solution of Unsaturated Group-Containing Resin (D) (Polymer Solution D1)

Into a 2-L separable flask equipped with a stirrer, a thermometer, a reflux condenser, a dropping funnel, and a nitrogen-introducing tube, 300 g of dipropylene glycol monomethyl ether (hereinafter referred to as "DPM") was introduced. After the temperature was raised to 95° C., 160 g of methacrylic acid (1.86 mol), 100 g of methyl methacrylate (1.0 mol), 200 g of DPM, and 16.6 g of t-butylperoxy-2-ethylhexanoate (PERBUTYL O; available from NOF Corporation) were added dropwise together over 3 hours. After the addition, the resulting mixture was aged for 4 hours to synthesize a base polymer solution having a carboxyl group. Next, to the base polymer solution, 160 g of 3,4-epoxycyclohexylmethyl acrylate (CYCLOMER A-200; available from Daicel Chemical Industries, Ltd.) (0.87 mol), TPP and TPPO at a molar ratio of 9/1 in a total amount of 1 part by weight based on the CYCLOMER A-200, and 1.0 g of methylhydroquinone were added, and the resulting mixture was allowed to react at 110° C. for 10 hours. The reaction was carried out in a mixed atmosphere of air and nitrogen. After the reaction, the reactant was diluted with DPM to a solid content of 36% by weight to obtain an unsaturated group-containing resin (D) (polymer solution D1) having an acid number of 135 KOH-mg/g, a double bond equivalent of 481, and a Mw of 15,000.

Synthesis Example 2

Synthesis of Solution of Unsaturated Group-Containing Resin (D) (Polymer Solution D2)

The same procedure as in Synthesis Example 1 was repeated except that the amount of methacrylic acid was changed to 145 g (1.69 mol) and the amount of methyl methacrylate to 80 g (0.8 mol) to obtain an unsaturated group-containing resin (D) (polymer solution D2) having an acid number of 71 KOH-mg/g, a double bond equivalent of 383, and a Mw of 14,000.

Synthesis Example 3

Synthesis of Solution of Unsaturated Group-Containing Resin (D) (Polymer Solution D3)

The same procedure as in Synthesis Example 1 was repeated except that methyl methacrylate was substituted with 110 g of hydroxy ethyl methacrylate (0.87 mol) to obtain an unsaturated group-containing resin (D) (polymer solution D3) having an acid number of 130 KOH-mg/g, a double bond equivalent of 496, and a Mw of 17,000.

Synthesis Example 4

Synthesis of Solution of Unsaturated Group-Containing Resin (D) (Polymer Solution D4)

The same procedure as in Synthesis Example 1 was repeated except that the amount of methacrylic acid was changed to 130 g (1.51 mol) to obtain an unsaturated group-containing resin (D) (polymer solution D4) having an acid number of 138 KOH-mg/g, a double bond equivalent of 470, and a Mw of 16,000.

Synthesis Example 5

Synthesis of Acrylic Resin Solution Z

Into a 500-mL flask, 1 g of 2,2'-azobis(isobutyronitrile) and 50 g of DPM were charged. Thereafter, 23.0 g of methacrylic acid, 31.5 g of benzyl methacrylate, and 32.8 g of tricyclo[5.2.1.0$^{2,6}$]decan-8-ylmethacrylate were charged and stirred at room temperature for some time. The flask was purged thoroughly with nitrogen by bubbling, and then heated at 70° C. for 5 hours under stirring. DPM was added to the resulting acrylic resin solution to a solids concentration of 36% by weight to obtain an acrylic resin solution Z. The Mw of the acrylic resin was 30,000.

Methods of evaluating the photosensitive resin compositions obtained in Examples and Comparative Examples are described below.

(a) Preparation of Cured Film

The photosensitive resin composition was applied to a 5-cm square TEMPAX glass substrate (available from AGC Tecno Glass Co., Ltd.) by rotating a spin coater (1H-360S; manufactured by Mikasa Co., Ltd.) at 500 rpm for 10 seconds and at 1000 rpm for 4 seconds, and then pre-baked at 90° C. for 2 minutes using a hot plate (SCW-636; Dainippon Screen Mfg. Co., Ltd.) to prepare a film with a thickness of 2 μm. The film prepared was exposed to light from an ultra-high pressure mercury lamp using a PLA (PLA-501F; manufactured by Canon Inc.) and cured in air at 230° C. for 1 hour using an oven (IHPS-222; manufactured by Espec Corp.) to obtain a cured film with a thickness of 1.5 μm. The thickness of the cured film was measured using Lambda Ace STM-602 (manufactured by Dainippon Screen Mfg. Co., Ltd.) at a refractive index of 1.55.

(b) Measurement of Transmittance of Photosensitive Resin Composition

For the transmittance of the 1.5-μm-thick cured film obtained, a transmittance at 400 nm was measured using an ultraviolet and visible spectrophotometer (UV-260); manufactured by Shimadzu Corporation).

(c) Measurement of Hardness of Cured Film

For the hardness of the 1.5-μm-thick cured film obtained, a pencil hardness was measured in accordance with JIS K 5600-5-4.

(d) Evaluation of Patternability of Photosensitive Resin Composition

The 2-μm pre-baked film obtained after the pre-baking in (a) above was exposed to light from an ultra-high pressure mercury lamp using a PLA through a gray scale mask for sensitivity measurement with a gap of 100 μm. The film was then shower-developed with a 0.4 wt % aqueous TMAH solution for 90 seconds using an automatic developing apparatus ("AD-2000 (trade name)" manufactured by Takizawa Sangyo Co., Ltd.), and then rinsed with water for 30 seconds. For a pattern formed, the sensitivity and the resolution were determined. The exposure amount was measured with an i-ray intensity meter.

(e) Evaluation of Adhesion of Photosensitive Resin Composition

A cured film with a thickness of 1.5 μm was formed on a glass substrate, on the surface of which ITO was sputtered, by the same method as in (a) above, treated with aqua regia (hydrochloric acid/nitric acid/water=3/1/10) at 25° C. for 2 minutes, and then washed with water for 5 minutes. The cured film after being washed with water was evaluated for adhesion between ITO and the cured film in accordance with JIS K 5600-5-6.

Specifically, on the ITO surface of the glass substrate, 11 parallel vertical straight lines and 11 parallel horizontal straight lines intersecting at right angles were drawn with a cutter knife at 1-mm intervals in such a manner that the cutter knife reached the base of the glass substrate to form 100 squares of 1 mm×1 mm. Cellophane adhesive tape (width=18 mm, adhesive strength=3.7 N/10 mm) was applied to the cured film surface with cuts and made to adhere to the cured film by rubbing with an eraser (meeting JIS S6050). The tape was held at one end and peeled off instantaneously while being kept perpendicular to the glass substrate. The number of squares remained was visually evaluated. Evaluation was made based on the peeled area of the squares according to the following criteria, and 3 or higher was evaluated as acceptable.

5: Peeled area=0%
4: Peeled area=<5%
3: Peeled area=5 to 14%
2: Peeled area=15 to 34%
1: Peeled area=35 to 64%
0: Peeled area=65 to 100%

(f) Measurement of Swelling Rate of Photosensitive Resin Composition

A cured film with a thickness of 1.5 μm was formed on a chromium-sputtered glass substrate by the same method as in (a) above, treated with a resist stripper N300 (manufactured by Nagase & Co., Ltd.) at 50° C. for 10 minutes, and then washed with water. The film thickness was measured before and after the treatment with the resist stripper (N-300; manufactured by Nagase ChemteX Corporation), and a swelling rate was calculated using the following equation.

Swelling rate (%)=(thickness after treatment−thickness before treatment)/(thickness before treatment)×100

Example 1

Under yellow light, 0.10 g of 2-methyl-1[4-(methylthio) phenyl]-2-morpholinopropan-1-one (Irgacure (registered trademark) IC-907; available from Ciba Specialty Chemicals K. K.), 0.01 g of 4-methoxyphenol (4MP), 0.025 g of 3-aminopropyltrimethoxysilane (KBM-903), 0.934 g of tris(acryloxyethyl)isocyanuric acid (E-1), 0.28 g of mono-[3-(3-acryloyloxy-2,2-bis-acryloyloxymethyl-propoxy)-2,2-bis-acryloyloxymethyl-propyl] succinate (M520), 0.19 g of dipentaerythritol hexaacrylate (DPHA), 3.20 g of diethylene glycol ethyl methyl ether (EDM), 2.40 g of 4-methoxybutanol (MB), 1.57 g of DPM, and 1.30 g of the polymer solution D1 were mixed and stirred. The resulting mixture was then filtered through a 0.45-μm filter to obtain a photosensitive resin composition. The photosensitive resin composition obtained was evaluated for transmittance and hardness, patternability (sensitivity and resolution), and adhesion and swelling rate. The results are shown in Table 2.

TABLE 1

|  | D1 | D2 | D3 | D4 | Z | E-1 | E-2 | KBM-903 | KBE-9103 | KBM-9007 | KBE-585 | IC-907 |
|---|---|---|---|---|---|---|---|---|---|---|---|---|
| Example 1 | 1.3 | 0 | 0 | 0 | 0 | 0.93 | 0 | 0.02 | 0 | 0 | 0 | 0.1 |
| Example 2 | 1.3 | 0 | 0 | 0 | 0 | 0.93 | 0 | 0.02 | 0 | 0 | 0 | 0.1 |
| Example 3 | 1.3 | 0 | 0 | 0 | 0 | 0.93 | 0 | 0.02 | 0 | 0 | 0 | 0.1 |
| Example 4 | 1.3 | 0 | 0 | 0 | 0 | 0.47 | 0 | 0.02 | 0 | 0 | 0 | 0.1 |
| Example 5 | 1.3 | 0 | 0 | 0 | 0 | 0.93 | 0 | 0.02 | 0 | 0 | 0 | 0.1 |
| Example 6 | 1.8 | 0 | 0 | 0 | 0 | 0.93 | 0 | 0.02 | 0 | 0 | 0 | 0.1 |
| Example 7 | 2.1 | 0 | 0 | 0 | 0 | 0.93 | 0 | 0.02 | 0 | 0 | 0 | 0.1 |
| Example 8 | 2.6 | 0 | 0 | 0 | 0 | 0.73 | 0 | 0.02 | 0 | 0 | 0 | 0.08 |

TABLE 1-continued

| | | | | | | | | | | | | |
|---|---|---|---|---|---|---|---|---|---|---|---|---|
| Example 9 | 0.8 | 0 | 0 | 0 | 0 | 0.93 | 0 | 0.02 | 0 | 0 | 0 | 0.1 |
| Example 10 | 0.5 | 0 | 0 | 0 | 0 | 0.93 | 0 | 0.02 | 0 | 0 | 0 | 0.1 |
| Example 11 | 0 | 1.3 | 0 | 0 | 0 | 0.93 | 0 | 0.02 | 0 | 0 | 0 | 0.1 |
| Reference Example 1 | 0 | 0 | 1.3 | 0 | 0 | 0.93 | 0 | 0.02 | 0 | 0 | 0 | 0.1 |
| Example 12 | 0 | 0 | 0 | 1.3 | 0 | 0.93 | 0 | 0.02 | 0 | 0 | 0 | 0.1 |
| Example 13 | 1.3 | 0 | 0 | 0 | 0 | 0 | 0.93 | 0.02 | 0 | 0 | 0 | 0.1 |
| Example 14 | 1.3 | 0 | 0 | 0 | 0 | 0.93 | 0 | 0 | 0.02 | 0 | 0 | 0.1 |
| Example 15 | 1.3 | 0 | 0 | 0 | 0 | 0.93 | 0 | 0 | 0 | 0.02 | 0 | 0.1 |
| Example 16 | 1.3 | 0 | 0 | 0 | 0 | 0.93 | 0 | 0 | 0 | 0 | 0.02 | 0.1 |
| Example 17 | 1.3 | 0 | 0 | 0 | 0 | 0.93 | 0 | 0.02 | 0 | 0 | 0 | 0 |
| Example 18 | 1.3 | 0 | 0 | 0 | 0 | 0.93 | 0 | 0.02 | 0 | 0 | 0 | 0.1 |
| Example 19 | 1.3 | 0 | 0 | 0 | 0 | 0.93 | 0 | 0.02 | 0 | 0 | 0 | 0.1 |
| Example 20 | 1.3 | 0 | 0 | 0 | 0 | 0.93 | 0 | 0.02 | 0 | 0 | 0 | 0.1 |
| Example 21 | 1.3 | 0 | 0 | 0 | 0 | 0.93 | 0 | 0.02 | 0 | 0 | 0 | 0.1 |
| Example 22 | 1.3 | 0 | 0 | 0 | 0 | 0 | 0.93 | 0 | 0 | 0 | 0 | 0 |
| Example 23 | 0 | 1.3 | 0 | 0 | 0 | 0.93 | 0 | 0 | 0 | 0 | 0 | 0 |
| Reference Example 2 | 0 | 0 | 1.3 | 0 | 0 | 0 | 0.93 | 0 | 0 | 0 | 0 | 0 |
| Comparative Example 1 | 0 | 0 | 0 | 0 | 1.3 | 0.93 | 0 | 0.02 | 0 | 0 | 0 | 0.1 |
| Comparative Example 2 | 1.3 | 0 | 0 | 0 | 0 | 0 | 0 | 0.02 | 0 | 0 | 0 | 0.1 |
| Comparative Example 3 | 1.3 | 0 | 0 | 0 | 0 | 0.93 | 0 | 0.02 | 0 | 0 | 0 | 0 |

| | OXE-1 | 4MP | TBC | I-1 | I-2 | MA | DPHA | DPM | EDM | MB |
|---|---|---|---|---|---|---|---|---|---|---|
| Example 1 | 0 | 0.01 | 0 | 0.28 | 0 | 0 | 0.19 | 1.6 | 3.2 | 2.4 |
| Example 2 | 0 | 0 | 0 | 0.28 | 0 | 0 | 0.19 | 1.6 | 3.2 | 2.4 |
| Example 3 | 0 | 0.01 | 0 | 0.28 | 0 | 0 | 0.19 | 3.2 | 0 | 4 |
| Example 4 | 0 | 0.01 | 0 | 0.28 | 0 | 0 | 0.19 | 1.6 | 3.2 | 2.4 |
| Example 5 | 0 | 0.1 | 0 | 0 | 0 | 0 | 0.47 | 1.6 | 3.2 | 2.4 |
| Example 6 | 0 | 0.1 | 0 | 0 | 0 | 0 | 0 | 1.6 | 3.2 | 2.4 |
| Example 7 | 0 | 0.01 | 0 | 0.28 | 0 | 0 | 0 | 1 | 3.2 | 2.4 |
| Example 8 | 0 | 0.01 | 0 | 0.21 | 0 | 0 | 0 | 0.7 | 3.2 | 2.4 |
| Example 9 | 0 | 0.01 | 0 | 0.28 | 0 | 0 | 0.37 | 1.9 | 3.2 | 2.4 |
| Example 10 | 0 | 0.01 | 0 | 0.28 | 0 | 0 | 0.47 | 2.1 | 3.2 | 2.4 |
| Example 11 | 0 | 0.01 | 0 | 0.28 | 0 | 0 | 0.19 | 1.6 | 3.2 | 2.4 |
| Reference Example | 0 | 0.01 | 0 | 0.28 | 0 | 0 | 0.19 | 1.6 | 3.2 | 2.4 |
| Example 12 | 0 | 0.01 | 0 | 0.28 | 0 | 0 | 0.19 | 1.6 | 3.2 | 2.4 |
| Example 13 | 0 | 0.01 | 0 | 0.28 | 0 | 0 | 0.19 | 1.6 | 3.2 | 2.4 |
| Example 14 | 0 | 0.01 | 0 | 0.28 | 0 | 0 | 0.19 | 1.6 | 3.2 | 2.4 |
| Example 15 | 0 | 0.01 | 0 | 0.28 | 0 | 0 | 0.19 | 1.6 | 3.2 | 2.4 |
| Example 16 | 0 | 0.01 | 0 | 0.28 | 0 | 0 | 0.19 | 1.6 | 3.2 | 2.4 |
| Example 17 | 0.39 | 0.01 | 0 | 0.28 | 0 | 0 | 0.19 | 1.6 | 3.2 | 2.4 |
| Example 18 | 0 | 0 | 0.01 | 0.28 | 0 | 0 | 0.19 | 1.6 | 3.2 | 2.4 |
| Example 19 | 0 | 0.01 | 0 | 0 | 0.28 | 0 | 0.19 | 1.6 | 3.2 | 2.4 |
| Example 20 | 0 | 0.01 | 0 | 0 | 0 | 0.28 | 0.19 | 1.6 | 3.2 | 2.4 |
| Example 21 | 0 | 0 | 0 | 0 | 0 | 0.28 | 0.19 | 1.6 | 3.2 | 2.4 |
| Example 22 | 0.1 | 0 | 0.01 | 0 | 0.3 | 0 | 0.19 | 1.6 | 3.2 | 2.4 |
| Example 23 | 0.1 | 0 | 0.01 | 0 | 0.3 | 0 | 0.19 | 1.6 | 3.2 | 2.4 |
| Reference Example 2 | 0.1 | 0 | 0.01 | 0 | 0.3 | 0 | 0.19 | 1.6 | 3.2 | 2.4 |
| Comparative Example 1 | 0 | 0.01 | 0 | 0.28 | 0 | 0 | 0.19 | 1.6 | 3.2 | 2.4 |
| Comparative Example 2 | 0 | 0.01 | 0 | 0.28 | 0 | 0 | 0.19 | 1.6 | 3.2 | 2.4 |
| Comparative Example 3 | 0 | 0.01 | 0 | 0.28 | 0 | 0 | 0.19 | 1.6 | 3.2 | 2.4 |

Note)
Unit of each item is "g".

TABLE 2

| | Resolution | Sensitivity | Film property after development | Hardness | Adhesion | Swelling ratio (%) | Transmittance (%) |
|---|---|---|---|---|---|---|---|
| Example 1 | 20 | 100 | good | 5H | 5B | 4 | 98 |
| Example 2 | 50 | 50 | good | 5H | 5B | 4 | 98 |
| Example 3 | 50 | 100 | good | 5H | 5B | 4 | 98 |
| Example 4 | 20 | 100 | good | 6H | 5B | 4 | 98 |
| Example 5 | 50 | 200 | good | 6H | 5B | 4 | 98 |
| Example 6 | 20 | 100 | good | 5H | 5B | 4 | 98 |
| Example 7 | 20 | 100 | good | 4H | 5B | 5 | 98 |
| Example 8 | 20 | 100 | good | 3H | 5B | 6 | 98 |

TABLE 2-continued

| | Resolution | Sensitivity | Film property after development | Hardness | Adhesion | Swelling ratio (%) | Transmittance (%) |
|---|---|---|---|---|---|---|---|
| Example 9 | 20 | 100 | good | 5H | 5B | 3 | 98 |
| Example 10 | 20 | 100 | good | 5H | 5B | 3 | 98 |
| Example 11 | 20 | 100 | good | 5H | 5B | 3 | 98 |
| Reference Example 1 | 20 | 100 | good | 5H | 5B | 3 | 98 |
| Example 12 | 20 | 100 | good | 5H | 5B | 7 | 98 |
| Example 13 | 20 | 100 | good | 5H | 5B | 3 | 98 |
| Example 14 | 10 | 100 | good | 5H | 5B | 3 | 98 |
| Example 15 | 15 | 100 | good | 5H | 5B | 3 | 98 |
| Example 16 | 10 | 100 | good | 5H | 5B | 3 | 98 |
| Example 17 | 20 | 100 | good | 5H | 5B | 3 | 98 |
| Example 18 | 10 | 40 | good | 5H | 5B | 4 | 98 |
| Example 19 | 20 | 100 | good | 5H | 5B | 4 | 98 |
| Example 20 | 20 | 100 | good | 5H | 5B | 4 | 98 |
| Example 21 | 50 | 50 | good | 5H | 5B | 4 | 98 |
| Example 22 | 20 | 100 | good | 5H | 3B | 4 | 98 |
| Example 23 | 20 | 100 | good | 5H | 3B | 4 | 98 |
| Reference Example 2 | 20 | 100 | good | 5H | 3B | 4 | 98 |
| Comparative Example 1 | 60 | 200 | residue existed | B | 0B | 15 | 96 |
| Comparative Example 2 | 60 | 100 | residue existed | 2H | 1B | 12 | 94 |
| Comparative Example 3 | — | — | dissolved thoroughly | — | — | — | — |

Examples 2 to 21, Reference Examples 1 to 2 and Comparative Examples 1 to 4

Using a composition as shown in Table 1, a photosensitive resin composition was obtained in the same manner as in Example 1 and evaluated in the same manner.

The evaluation results are shown in Table 2. The compounds used are as follows:
OXE-01: 1,2-octanedione, 1[4-(phenylthio)-2-(O-benzoyloxime)] (Irgacure (registered trademark) OXE-01; available from Ciba Specialty Chemicals K. K.)
DPHA: Dipentaerythritol hexaacrylate (KAYARAD (registered trademark) DPHA)
4MP: 4-methoxyphenol
I-1: Mono-[3-(3-acryloyloxy-2,2-bis-acryloyloxymethyl-propoxy)-2,2-bis-acryloyloxymethyl-propyl] succinate
I-2: Mono-[3-(3-acryloyloxy-2,2-bis-acryloyloxymethyl-propyl] succinate
TBC: t-butylcatechol
E-2: Tris(acryloxybutyl)isocyanuric acid Example 22

Figure 1A:
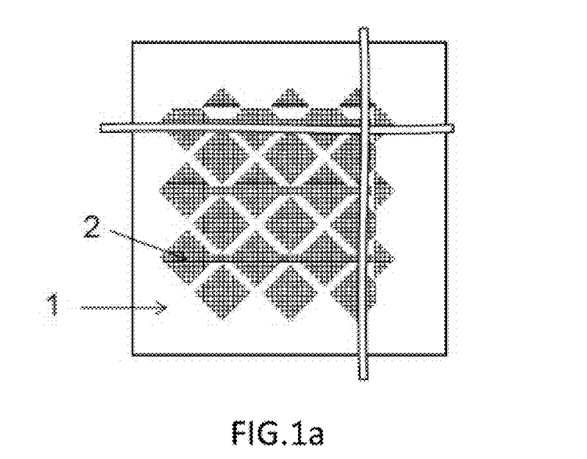
FIG. 1a is schematic top view illustrating a touch panel member in state (a) after formation of transparent electrodes.
Figure 1B:
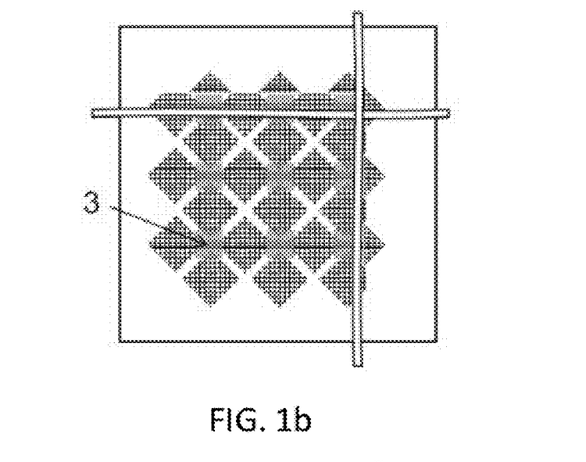
FIG. 1b is a schematic top view illustrating a touch panel member in state (b) after formation of insulating films.
Figure 1C:
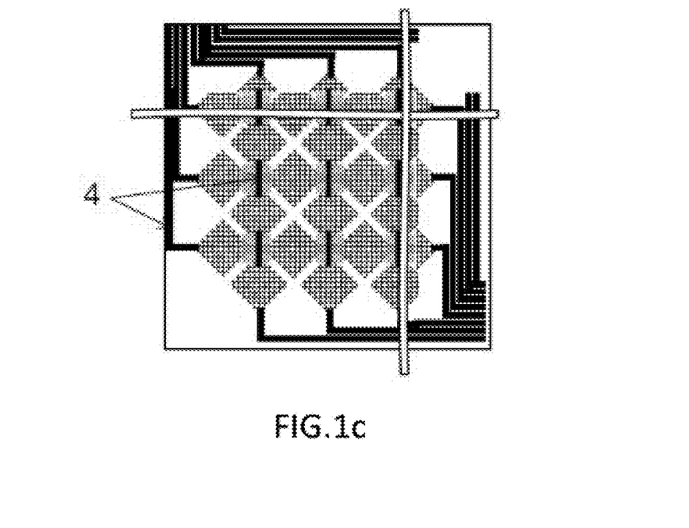
FIG. 1c is a schematic top view illustrating a touch panel member in state (c) after formation of conductive wires.
Figure 2:
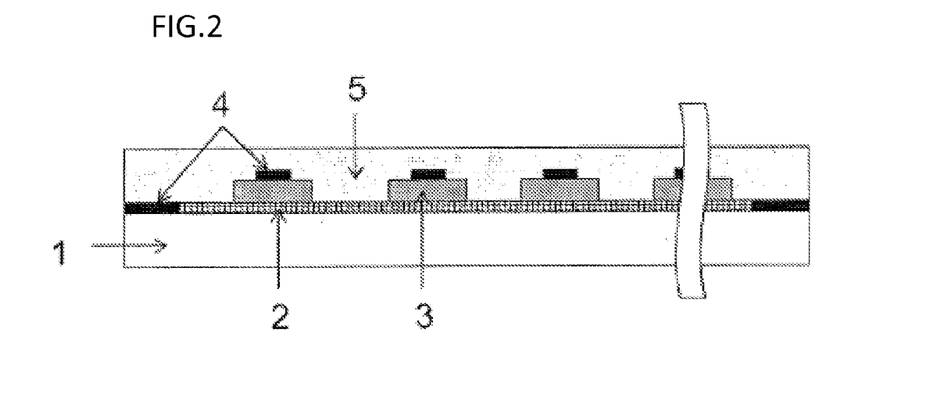
FIG. 2 is a schematic cross-sectional view illustrating a touch panel member.

A touch panel member was prepared according to the following procedure.
(Formation of ITO)
On a glass substrate with a thickness of about 1 mm, ITO with a thickness of 150 nm and a surface resistance of 15Ω/□ was deposited by performing sputtering at an RF power of 1.4 kW and a vacuum degree of $6.65 \times 10^{-1}$ Pa for 12.5 minutes using a sputtering system (HSR-521A; manufactured by Shimadzu Corporation). A positive-tone photoresist (OFPR-800; available from Tokyo Ohka Kogyo Co., Ltd.) was applied thereto, and pre-baked at 80° C. for 20 minutes to obtain a resist film with a thickness of 1.1 μm. Using a PLA, the resist film obtained was pattern-exposed to an ultra-high pressure mercury lamp through a mask, after which the resist film was shower-developed with a 2.38 wt % aqueous TMAH solution for 90 seconds using an automatic developing apparatus, and then rinsed with water for 30 seconds. Thereafter, ITO was etched by immersion into a mixed solution of HCl/$HNO_3$/$H_2O$ (at a weight ratio of 18/4.5/77.5) at 40° C. for 80 seconds, and the photoresist was removed by treatment with a stripping solution (N-300; available from Nagase ChemteX Corporation) at 50° C. for 120 seconds to prepare a glass substrate having patterned ITO (symbol 2 in FIG. 1a and FIG. 2) with a thickness of 150 nm (corresponding to FIG. 1a).
(Formation of Transparent Insulating Film)
On the glass substrate obtained having ITO, a cured film (transparent insulating film; symbol 3 in FIG. 1b and FIG. 2) was formed using the photosensitive resin composition obtained in Example 1 by the same method as in (a) above (corresponding to FIG. 1b).
(Formation of MAM Wire)
On the glass substrate obtained, MAM wires (symbol 4 in FIG. 1c and FIG. 2) were formed in the same manner as in (1) except using molybdenum and aluminum as a target and a mixed solution of $H_3PO_4$/$HNO_3$/$CH_3COOH$/$H_2O$ (at a weight ratio of 65/3/5/27) as an etchant (corresponding to FIG. 1c).
(Formation of Transparent Protecting Film)
On the glass substrate obtained, a cured film (transparent protecting film; symbol 5 in FIG. 2) was formed using the photosensitive resin composition obtained in Example 1 by the same method as in (a) above. A continuity test at a connection was performed using a tester, and continuity of current was observed (corresponding to FIG. 2).

DESCRIPTION OF SYMBOLS

1: Glass substrate
2: ITO (transparent electrode)
3: Transparent insulating film
4: MAM wire (wire electrode)
5: Transparent protecting film The photosensitive resin composition of the present invention is suitably used to form, for example, a protecting film for touch panels.

The invention claimed is:

1. A photosensitive resin composition, comprising:
an unsaturated group-containing resin (D);
a (meth)acrylic compound (E) represented by Formula (21) below; and
a photo-polymerization initiator (F), the unsaturated group-containing resin (D) being obtained by adding an epoxy group-containing unsaturated compound (C) to some acid radicals of a copolymer obtained by copolymerizing a (meth)acrylic ester (A) with an unsaturated group- and acid-containing compound (B):

[Chemical Formula 21]

(21)

(wherein $R^{14}$, $R^{15}$, and $R^{16}$ each independently represent hydrogen or methyl, and $R^{17}$, $R^{18}$, and $R^{19}$ represent $C_1$-$C_{10}$ alkylene, phenylene, or cyclohexyl), wherein the (meth)acrylic ester (A) is a (meth)acrylic ester represented by Formula (1) and/or Formula (2) below; the unsaturated group- and acid-containing compound (B) is a (meth)acrylic acid; and the epoxy group-containing unsaturated compound (C) is a compound represented by Formula (6) and/or Formula (7) below:

[Chemical Formula 1]

(1)

(wherein $R^1$ represents hydrogen or methyl, and $R^2$ represents $C_1$-$C_{10}$ alkyl or an aromatic group);

[Chemical Formula 2]

(2)

(wherein $R^3$ represents hydrogen or methyl; $R^4$ and $R^5$ each independently represent $C_1$-$C_{10}$ alkylene, phenylene, or naphthalene; $R^6$ represents $C_1$-$C_6$ alkyl or phenyl; l represents an integer of 0 or 1; and n represents an integer of 0 to 6);

[Chemical Formula 6]

(6)

(wherein $R^{11}$ represents hydrogen or methyl; and $R^{12}$ represents a direct bond or a $C_1$-$C_{10}$ divalent hydrocarbon group); and

[Chemical Formula 7]

(7)

(wherein $R^{11}$ represents hydrogen or methyl, and m represents an integer of 1 to 10).

2. The photosensitive resin composition according to claim 1, comprising a polymerization inhibitor (H).

3. The photosensitive resin composition according to claim 1, comprising a carboxylic acid-containing compound (I) represented by a general formula selected from the group consisting of Formula (22), Formula (23), and Formula (24) below:

[Chemical Formula 22]

(22)

[Chemical Formula 23]

(23)

[Chemical Formula 24]

(24)

(wherein, X each independently represents hydrogen, $C_1$-$C_6$ alkyl, acryloyl, or methacryloyl, provided that at least one X is acryloyl or methacryloyl; Y represents $C_1$-$C_{10}$ alkylene, $C_2$-$C_6$ alkylene having one unsaturated bond, phenylene, or cyclohexyl; and P represents an integer of 0 to 6).

4. The photosensitive resin composition according to claim 1, which is a negative-tone photosensitive resin composition.

5. A film obtained by curing the photosensitive resin composition according to claim 1 for protecting conductive wire.

6. A film according to claim 1 for protecting molybdenum-containing conductive wire.

7. A touch panel member, comprising a cured film obtained by curing the photosensitive resin composition according to claim 1.

8. The photosensitive resin composition according to claim 1, further comprising a silane compound (G) having at least one substituent selected from the group consisting of an amino group, an amide group, a ureido group, a ketimine group, and an isocyanate group.

* * * * *